(12) United States Patent
Chen et al.

(10) Patent No.: US 8,020,821 B2
(45) Date of Patent: Sep. 20, 2011

(54) WALL HANGER AND ASSEMBLY OF THE WALL HANGER AND A COMPUTER DEVICE

(75) Inventors: Dong-Ying Chen, Hsichih Taipei Hsien (TW); Hung-Chang Huang, Hsichih Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 133 days.

(21) Appl. No.: 12/489,894

(22) Filed: Jun. 23, 2009

(65) Prior Publication Data

US 2010/0176261 A1 Jul. 15, 2010

(30) Foreign Application Priority Data

Jan. 9, 2009 (CN) .................... 2009 2 0000646 U

(51) Int. Cl.
*A47B 96/06* (2006.01)
(52) U.S. Cl. ......... 248/220.22; 248/221.11; 248/224.51; 248/917; 361/679.21
(58) Field of Classification Search ............. 248/220.22, 248/221.11, 224.51, 917, 224.61, 225.11, 248/496; 361/679.21, 679.23, 679.29
See application file for complete search history.

(56) References Cited

U.S. PATENT DOCUMENTS

| | | | | |
|---|---|---|---|---|
| 1,252,207 A | * | 1/1918 | Walker | 248/224.51 |
| 2,174,140 A | * | 9/1939 | Schofield | 248/224.51 |
| 5,730,406 A | * | 3/1998 | Chen | 248/223.41 |
| 5,833,189 A | * | 11/1998 | Rossman et al. | 248/231.61 |
| 5,850,996 A | * | 12/1998 | Liang | 248/221.11 |
| 6,173,931 B1 | * | 1/2001 | Johnson et al. | 248/222.11 |
| 6,315,255 B1 | * | 11/2001 | Chan et al. | 248/221.11 |
| 6,371,424 B1 | * | 4/2002 | Shaw | 248/222.12 |
| 6,431,510 B1 | * | 8/2002 | Lydecker et al. | 248/216.1 |
| 6,702,604 B1 | * | 3/2004 | Moscovitch | 439/374 |
| 6,758,454 B2 | * | 7/2004 | Smed | 248/314 |
| 6,877,641 B2 | * | 4/2005 | Howland | 222/180 |
| 7,261,264 B2 | * | 8/2007 | Moran | 248/222.11 |
| 7,334,762 B2 | * | 2/2008 | Dittmer | 248/221.11 |
| 7,455,271 B2 | * | 11/2008 | Pincek et al. | 248/288.31 |
| 7,499,272 B2 | * | 3/2009 | Searby et al. | 361/679.22 |
| 7,673,838 B2 | * | 3/2010 | Oddsen et al. | 248/278.1 |
| 2006/0186290 A1 | * | 8/2006 | Carnevali | 248/221.11 |
| 2007/0097617 A1 | * | 5/2007 | Searby et al. | 361/686 |
| 2007/0170336 A1 | * | 7/2007 | Li | 248/324 |
| 2007/0230102 A1 | | 10/2007 | Tsai | |
| 2008/0105803 A1 | * | 5/2008 | Tu | 248/220.22 |

* cited by examiner

*Primary Examiner* — Terrell McKinnon
*Assistant Examiner* — Bradley H Duckworth
(74) *Attorney, Agent, or Firm* — Stephen A. Bent; Foley & Lardner LLP

(57) ABSTRACT

A wall hanger includes first and second components. The first component includes a first main body for mounting to a computer device, an insert member provided on the first main body, and a first engaging member provided on the first main body and located above the insert member. The second component includes a second main body for mounting to a wall surface, an insertion groove portion provided on the second main body, and a second engaging member provided on the second main body and located above the insertion groove portion. The insert member is inserted into the insertion groove portion along an insertion direction until the first engaging member is brought into engagement with the second engaging member.

18 Claims, 7 Drawing Sheets

WALL HANGER AND ASSEMBLY OF THE WALL HANGER AND A COMPUTER DEVICE

CROSS-REFERENCE TO RELATED APPLICATION

This application claims priority of Chinese Application No. 200920000646.4, filed on Jan. 9, 2009.

BACKGROUND OF THE INVENTION

1. Field of the Invention

The invention relates to a wall hanger, more particularly to a wall hanger for hanging a computer device on a wall surface.

2. Description of the Related Art

U.S. Patent Application Publication No. 2007/0230102 discloses a mini personal computer (so-called mini PC) having a size smaller than that of an ordinary desktop computer. As a mini PC is much smaller than a desktop computer, it has the advantages of occupying less space, lightweight, portability, etc.

Because of its lightweight and portability, the mini PC may be moved from place to place or may be put in a fixed place during use. In addition, electronic devices such as displays may be hung on a wall to save space due to space utilization planning or design considerations. Thus, it would be highly desirable to develop a positioning structure that permits mounting of the mini PC on a wall surface, for example, and dismounting of the mini PC therefrom for carrying, and that is convenient to operate.

SUMMARY OF THE INVENTION

Therefore, an object of the present invention is to provide a wall hanger for mounting a computer device removably on a wall surface.

Another object of the present invention is to provide a wall hanger that is easy to operate and that can be manufactured at low costs.

Still another object of the present invention is to provide an assembly of the wall hanger and a computer device.

Accordingly, the wall hanger of this invention includes a first component and a second component. The wall hanger is for hanging a computer device on a wall surface. The first component includes a first main body for mounting to the computer device, an insert member provided on the first main body, and a first engaging member provided on the first main body and located above the insert member. The second component includes a second main body for mounting to the wall surface, an insertion groove portion provided on the second main body, and a second engaging member provided on the second main body and located above the insertion groove portion. The insert member is inserted into the insertion groove portion along an insertion direction until the first engaging member is brought into engagement with the second engaging member.

The first engaging member is engageable with the second engaging member to limit displacement of the first component relative to the second component in a direction opposite to the insertion direction.

The assembly of this invention includes the aforesaid wall hanger and a computer device. The computer device includes a housing and an electronic component module provided in the housing.

The advantageous effect of the present invention resides in that the computer device can be removably hung on a wall surface by virtue of the interengagement between the first and second components of the wall hanger. In addition, the wall hanger is simple in structure and easy to operate, and can be manufactured at low costs.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
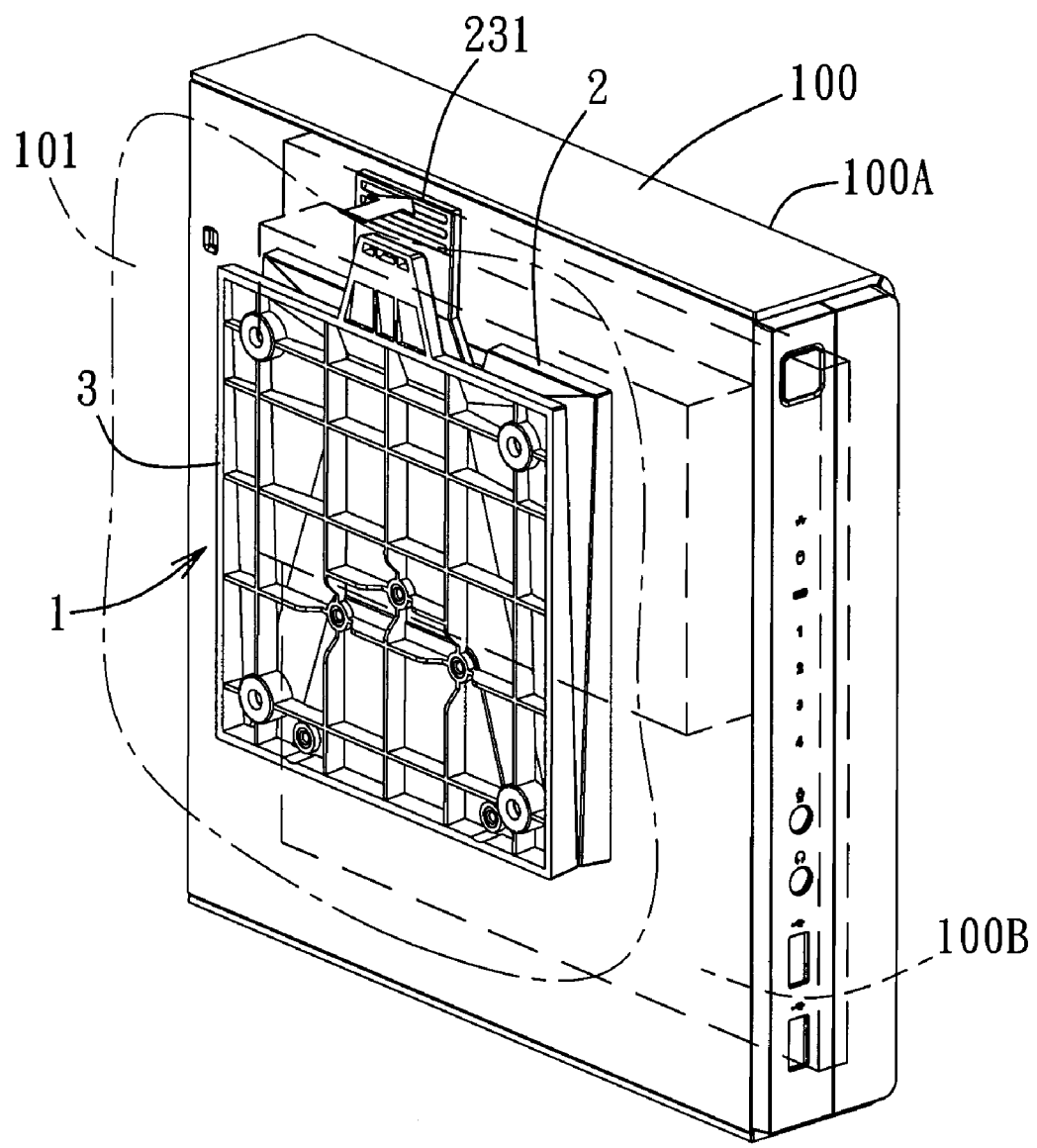
FIG. 1 is a perspective view to illustrate the preferred embodiment of a wall hanger according to the present invention when used to mount a computer device onto a wall surface.
Figure 2:
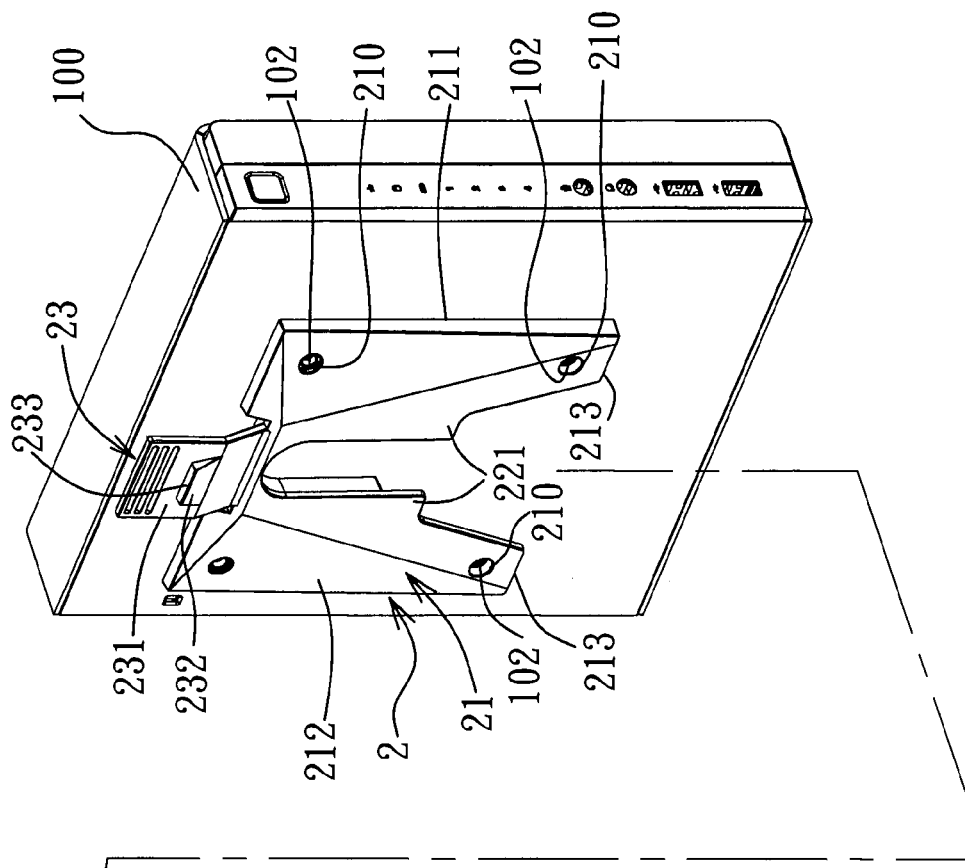
FIG. 2 is an exploded perspective view to illustrate first and second components of the preferred embodiment that are respectively secured to the computer device and the wall surface.
Figure 2:
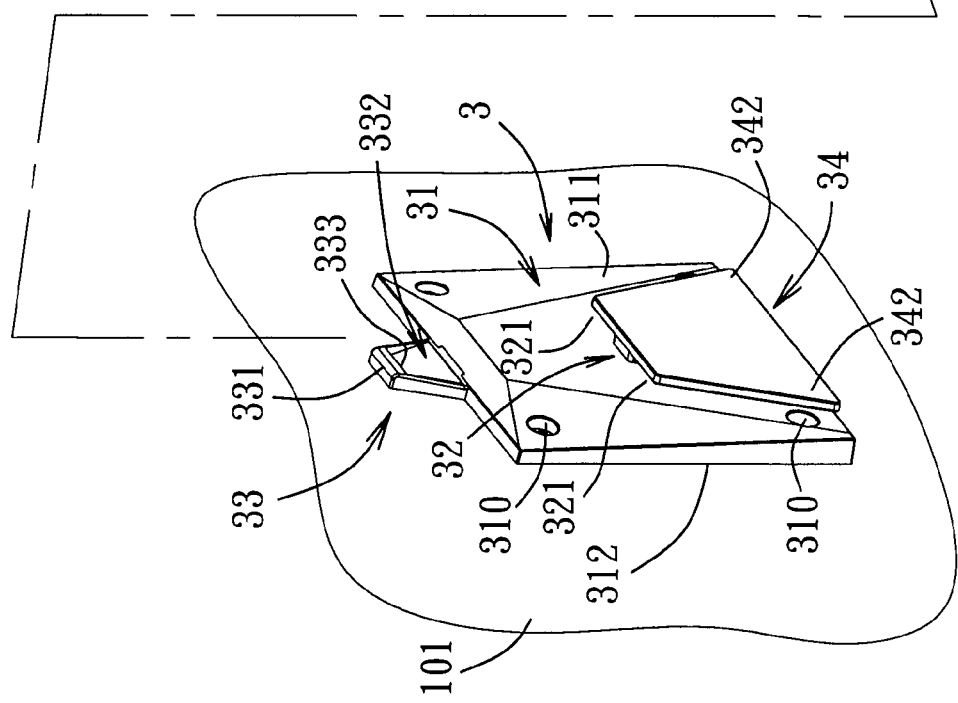

Referring to FIGS. 1 and 2, the preferred embodiment of a wall hanger 1 according to the present invention is shown to include a first component 2 and a second component 3. The first component 2 is fastened fixedly to a housing (100A) of a computer device 100, and the second component 3 is fastened fixedly to a wall surface 101 (such as the surface of a wall of a room). Through interengagement between the first and second components 2, 3, the computer device 100 can be hung on the wall surface 101. In this embodiment, the computer device 100 is a mini PC that includes the housing (100A) and an electronic component module (100B) provided in the housing (100A). The electronic component module (100B) includes a motherboard, a central processing unit, and a data storage unit.

Figure 3:
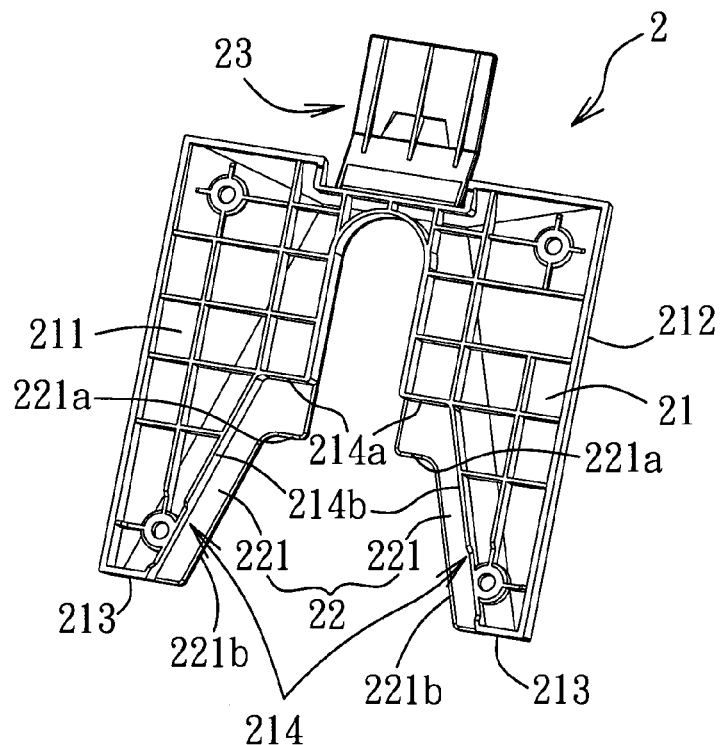
FIG. 3 is a perspective view to illustrate the first component of the preferred embodiment.

Referring to FIGS. 2 and 3, the first component 2 includes a first main body 21, an insert member 22 provided on the first main body 21, and a first engaging member 23 provided on the first main body 21 and located above the insert member 22. The first main body 21 has a front face 211 and a rear face 212. In this embodiment, the first main body 21 includes two plate portions 213 that have upper parts connected to each other and lower parts spaced apart from each other. Each of the plate portions 213 has an inner lateral boundary, and includes a ridge 214 that projects from the front face 211 along the inner lateral boundary, and that has a horizontal section (214a) and an inclined section (214b) connected to and extending inclinedly downward from the horizontal section (214a). The inclined sections (214b) of the two plate portions 213 have top ends disposed closer to each other, and bottom ends disposed farther from each other compared to the top ends of the inclined sections (214b).

The insert member 22 includes two insert pieces 221 that extend respectively and integrally from the inner lateral boundaries of the plate portions 213 and outwardly of the ridges 214, respectively, and that extend toward each other. Each of the insert pieces 221 has a horizontal outer edge (221a) spaced apart from the horizontal section (214a), and an inclined outer edge (221b) connected to and extending inclinedly downward from the horizontal outer edge (221a) and spaced apart from the inclined section (214b) of the respective ridge 214. The inclined outer edges (221b) of the insert pieces 221 have top ends disposed closer to each other, and bottom ends disposed farther from each other compared to the top ends of the inclined outer edges (221b).

The first engaging member 23 includes a first extension piece 231 extending upwardly from the first main body 21, and an engaging block 232 projecting from a rear face of the first extension piece 231 and having a top side 233.

In addition, in this embodiment, the first main body 21 is provided with a plurality of fastening holes 210, and the housing (100A) of the computer device 100 is provided with a plurality of threaded holes 102. The fastening holes 210 and the threaded holes 102 may be holes complying with the VESA specification. Screws (not shown) may be extended through the fastening holes 210 and the threaded holes 102 to fasten the first component 2 to the computer device 100, with the front face 211 of the first main body 21 confronting the computer device 100.

Figure 4:
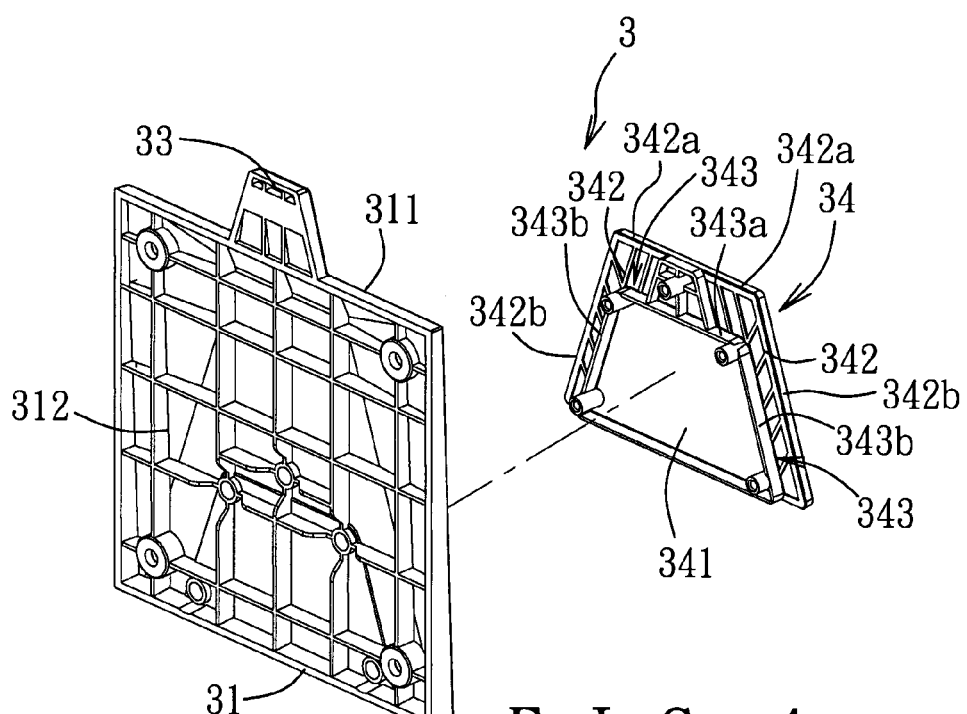
FIG. 4 is an exploded perspective view to illustrate the second component of the preferred embodiment.

Referring to FIGS. 2 and 4, the second component 3 includes a second main body 31, a third main body 34, an insertion groove portion 32 provided on the second main body 31, and a second engaging member 33 provided on the second main body 31 and located above the insertion groove portion 32. The second main body 31 is in the form of a plate, and has a front face 311 and a rear face 312. The insertion groove portion 32 includes two insertion grooves 321 disposed at the front face 311 of the second main body 31 and respectively having top openings. In this embodiment, the two insertion grooves 321 are cooperatively defined by the second main body 31 and the third main body 34 which is fastened to and which is partially spaced apart from the front face 311 of the second main body 31. The third main body 34 includes left and right supporting ribs 343 that project from a rear face thereof and that configure the third main body 34 into a central securing portion 341 secured to the front face 311 of the second main body 31, and left and right peripheral portions 342. Each of the left and right supporting ribs 343 has a horizontal section (343a) and an inclined section (343b) connected to and extending downwardly and inclinedly from the horizontal section (343a). The inclined sections (343b) have top ends disposed closer to each other and bottom ends disposed farther from each other compared to the top ends of the inclined sections (343b). Each of the left and right peripheral portions 342 is spaced apart from the front face 311 of the second main body 31 to cooperatively define a respective one of the insertion grooves 321 with the front face 311 of the second main body 31 and a respective one of the left and right supporting ribs 343, and has a top edge (342a) and an inclined lateral edge (342b). In this embodiment, the third main body 34 is of a generally trapezoidal shape.

The second engaging member 33 includes a second extension piece 331 extending upwardly from the second main body 31, and an engaging recess 332 formed in a front face of the second extension piece 331. The engaging recess 332 is defined by a wall surface that includes a downwardly facing inner top side 333.

The second main body 31 of the second component 3 is also formed with a plurality of fastening holes 310 complying with the VESA specification. With the provision of the fastening holes 310, the second component 3 can be fastened to the wall surface 101 with the rear face 312 of the second main body 31 confronting the wall surface 101. In this embodiment, the first component 2 and the second main body 31 of the second component 3, as well as the third main body 34 defining the insertion groove portion 32 with the second main body 31 of the second component 3, are all made from plastic by injection molding.

Figure 5:
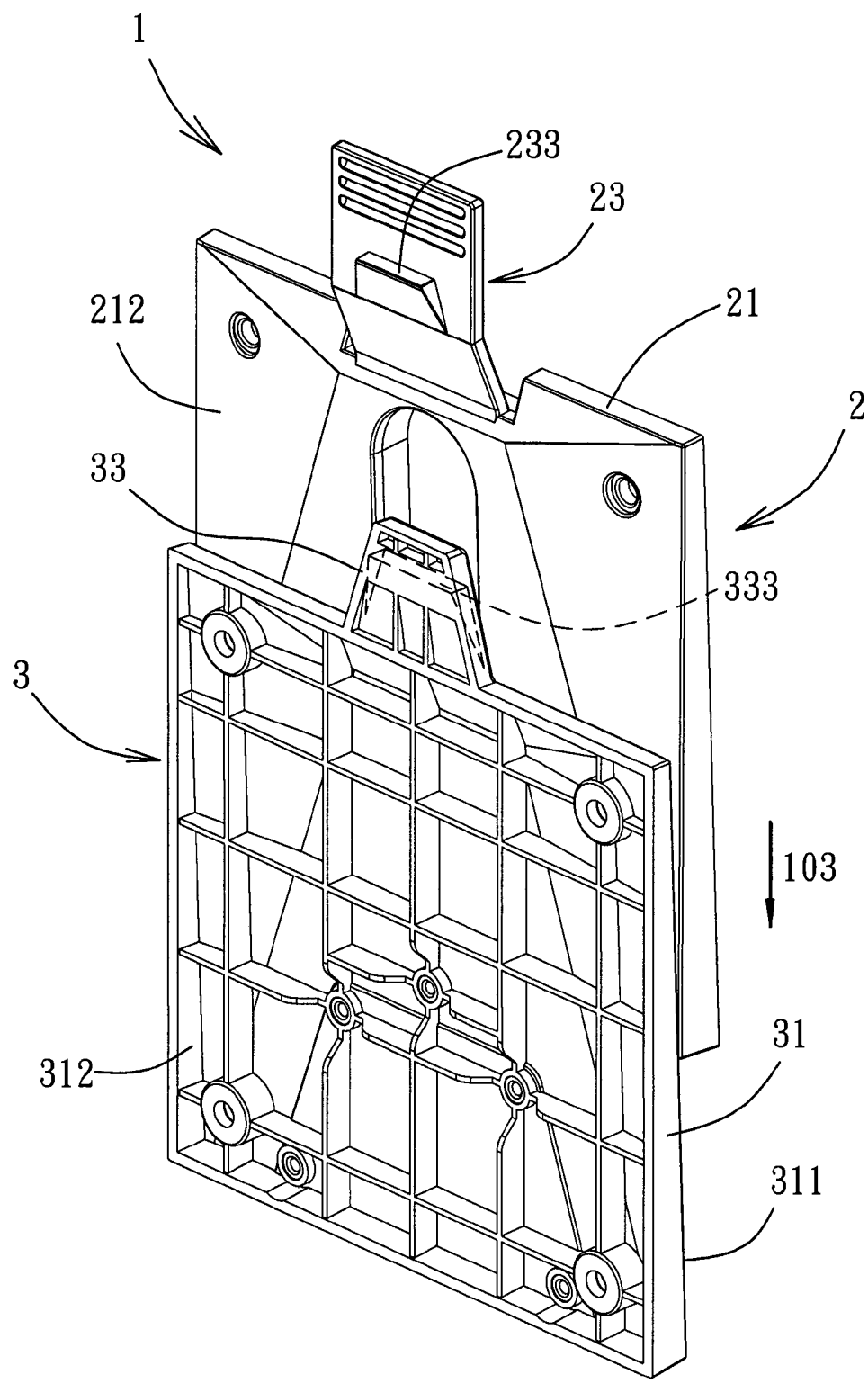
FIG. 5 is a perspective view illustrating how the first component is coupled to the second component.
Figure 6:
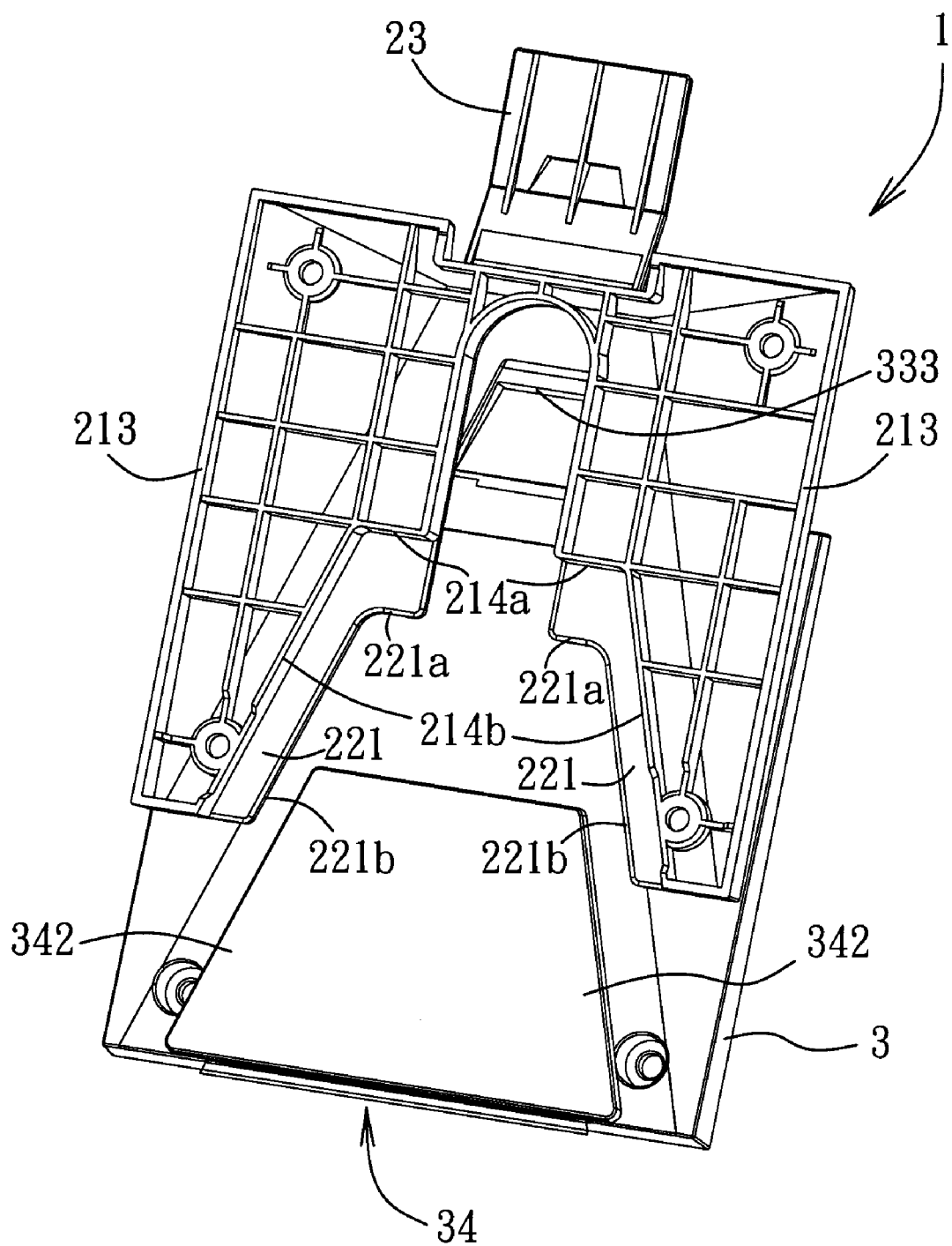
FIG. 6 is another perspective view illustrating how the first component is coupled to the second component, but from another angle.
Figure 7:
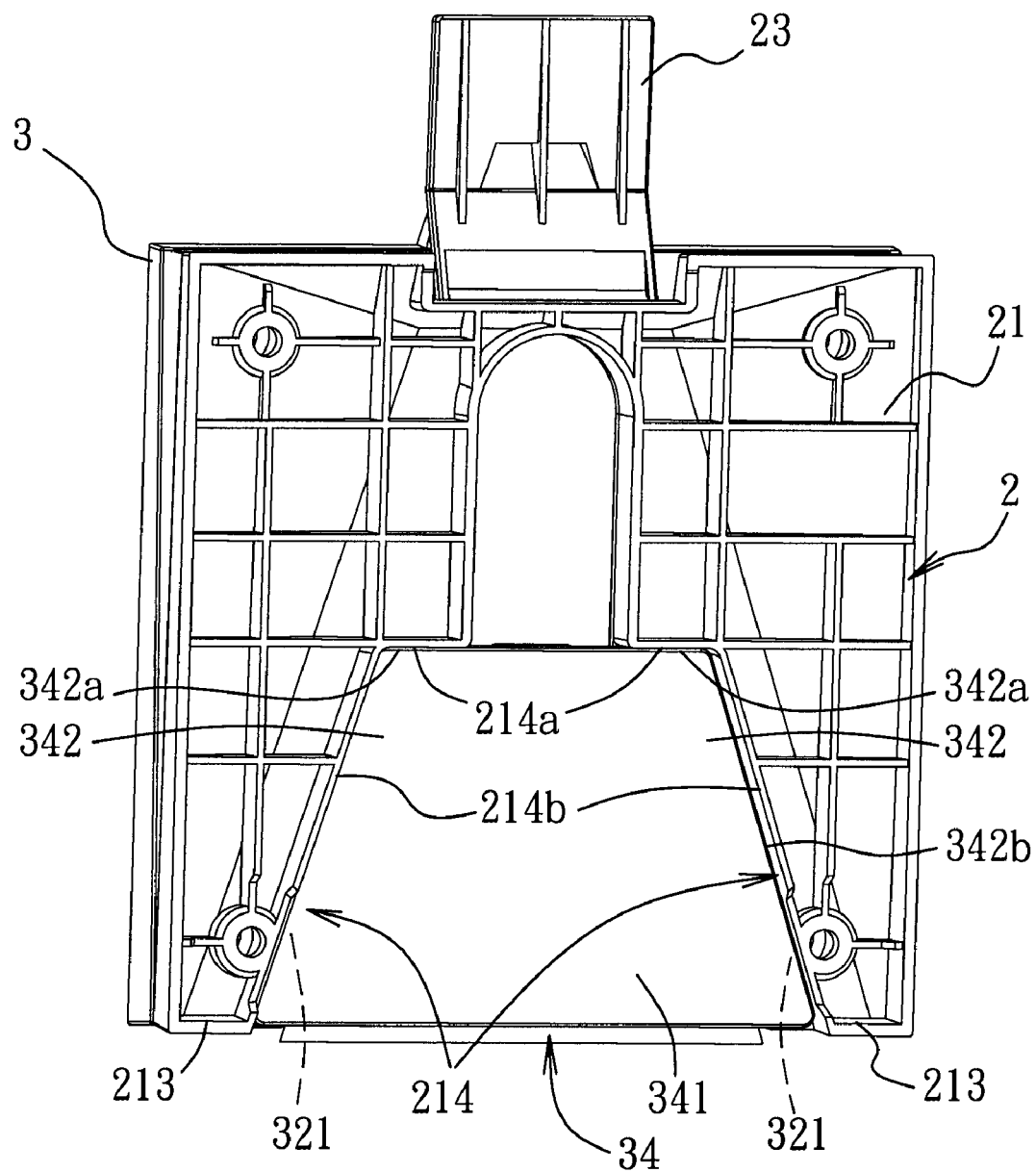
FIG. 7 is a perspective view illustrating the first and second components in a coupled state.
Figure 8:
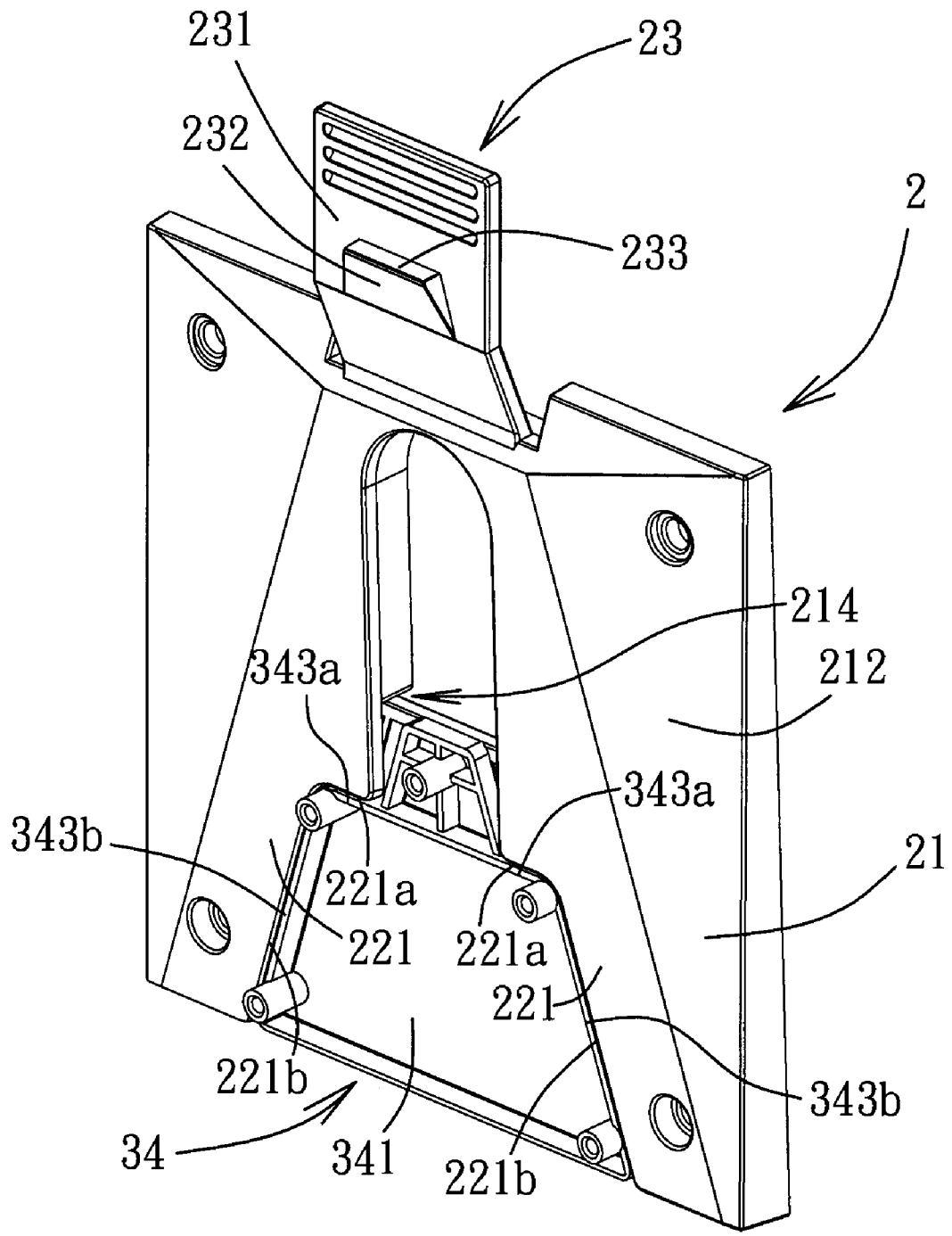
FIG. 8 is a perspective view illustrating the coupling relationship between the first component and a third main body of the second component when the first and second components are in the coupled state.

Referring to FIGS. 2, 5 and 6, when it is desired to hang the computer device 100 on the wall surface 101 through the wall hanger 1, the first and second main bodies 21, 31 are first fastened to the computer device 100 and the wall surface 101, respectively. Subsequently, the rear face 212 of the first main body 21 of the first component 2 is brought to confront the front face 311 of the second main body 31 of the second component 3, with the insert pieces 221 of the first component 2 disposed above the insertion grooves 321 of the second component 3. Next, with further reference to FIGS. 7 and 8, the first component 2 is moved toward the second component 3 along a top-down insertion direction 103 (see FIG. 5), so that the insert pieces 221 of the first component 2 are respectively inserted into the insertion grooves 321 of the second component 3 to be disposed between the front face 311 of the second main body 31 and the respective peripheral portion 342 of the third main body 34, and the first engaging member 23 is brought to engage the second engaging member 33, thereby completing the operation of hanging the computer device 100 on the wall surface 101. At this time, the rear face 212 of the first main body 21 confronts the front face 311 of the second main body 31. To clearly illustrate the structural relationship between the insert pieces 221 and the third main body 34, the second main body 31 of the second component 3 is omitted in FIG. 8.

It is noted that the left and right peripheral portions 342 not only serve to define the insertion grooves 321 for receiving the insert pieces 221 of the first component 2, they also provide a stopping function by preventing the insert pieces 221 of the first component 2 from slipping from the second component 3. Preferably, after the insert pieces 221 of the first component 2 are inserted into the insertion grooves 321 of the second component 3, the insert pieces 221 are respectively supported on the left and right supporting ribs 343 of the central securing portion 341, and the ridges 214 of the plate portions 213 rest respectively against outer edges of the left and right peripheral portions 342. Thus, the weight of the computer device 100 can be supported. Certainly, due to size considerations in design and manufacturing deviations, there may be the case that only the insert pieces 221 are supported on the left and right supporting ribs 343 or only the ridges 214 rest against the outer edges of the left and right peripheral portions 342 after the insert pieces 221 are inserted into the insertion grooves 321. Nonetheless, the same supporting effect can be achieved.

More specifically, after the insert pieces 221 of the first component 2 are inserted into the insertion grooves 321 of the second component 3, the horizontal sections (214a) of the ridges 214 of the two plate portions 213 rest against the top edges (342a) of the left and right peripheral portions 342, and the horizontal outer edges (221a) of the insert pieces 221 are respectively supported on the horizontal sections (343a) of the left and right supporting ribs 343 of the central securing portion 341. In addition, the structural cooperation between the inclined sections (214b) of the ridges 214 of the plate portions 213 and the inclined lateral edges (342b) of the left and right peripheral portions 342, and between the inclined outer edges (221b) of the insert pieces 221 and the inclined sections (343b) of the left and right supporting ribs 343 of the central securing portion 341 can likewise provide a supporting function.

When the engaging block 232 of the first engaging member 23 engages the engaging recess 332 in the second engaging member 33, the top side 233 of the engaging block 232 is correspondingly below the inner top side 333 of the wall surface defining the engaging recess 332 so that upward displacement of the first component 2 relative to the second component 3 is arrested, thereby preventing undesirable slippage of the first component 2 from the second component 3 in case the first component 2 is inadvertently moved upwardly.

It is noted that, in a preferred configuration, when the first component 2 is insertably coupled to the second component 3, the rear face 212 of the first main body 21 should abut against the front face 311 of the second main body 31, at least partially, so as to prevent forward or rearward wobbling of the first component 2 relative to the second component 3, thereby reducing instability of the computer device 100 hanging on the wall surface 101.

When removal of the computer device 100 from the wall surface 101 is desired, the first extension piece 231 of the first engaging member 23 is pulled forwardly (in a direction indicated by the arrow in FIG. 1), so that the first extension piece 231 undergoes a slight elastic deformation to thereby permit the engaging block 232 to disengage from the engaging recess 332 in the second engaging member 33. Subsequently, the first component 2 is moved upwardly relative to the second component 3 so that the insert pieces 221 thereof are disengaged from the insertion grooves 321 of the second component 3, thereby separating the first component 2, along with the computer device 100, from the second component 3 fastened to the wall surface 101.

In sum, with the arrangement of the first component 2 and the second component 3 which can be insertably and removably coupled to each other, the computer device 100 can be easily hung on the wall surface 101 and can be easily taken down. Since the wall hanger 1 of this invention has a simple structure, is easy to operate, and can be manufactured at low costs, the objects of this invention are accordingly achieved.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A wall hanger for hanging a computer device on a wall surface, said wall hanger comprising:
a first component including a first main body for mounting to the computer device, an insert member provided on said first main body, and a first engaging member provided on and extending upwardly from said first main body and located above said insert member; and
a second component including a second main body for mounting to the wall surface, an insertion groove portion provided on said second main body, and a second engaging member provided on and extending upwardly from said second main body and located above said insertion groove portion, said insert member being inserted into said insertion groove portion along an insertion direction until said first engaging member is brought into engagement with said second engaging member, said first engaging member configured to be pulled toward the computer device so that said first engaging member undergoes an elastic deformation to thereby permit said first engaging member to disengage from said second engaging member.

2. The wall hanger of claim 1, wherein said first main body includes two plate portions partially spaced apart from each other, said insert member including two insert pieces extending respectively and integrally from said plate portions, said second main body having a rear face for confronting the wall surface, and a front face, said insertion groove portion including two insertion grooves provided at said front face of said second main body and respectively having top openings, said insert pieces being inserted respectively into said insertion grooves in a top-down direction.

3. The wall hanger of claim 2, wherein said second component further includes a third main body that is partially spaced apart from said front face of said second main body so as to cooperatively define said insertion grooves with said second main body.

4. The wall hanger of claim 3, wherein said third main body includes left and right supporting ribs that project from a rear face thereof and that configure said third main body into a central securing portion secured to said front face of said second main body, and left and right peripheral portions, each of said left and right peripheral portions being spaced apart from said front face of said second main body to cooperatively define a respective one of said insertion grooves with said front face of said second main body and a respective one of said left and right supporting ribs, said insert pieces resting respectively against said left and right supporting ribs when respectively inserted into said insertion grooves.

5. The wall hanger of claim 2, wherein said first main body has a front face for confronting the computer device and a rear face disposed to confront said second main body, said first engaging member including a first extension piece extending upwardly from said first main body and an engaging block projecting from a rear face of said first extension piece, said engaging block having a top side.

6. The wall hanger of claim 5, wherein said second engaging member includes a second extension piece extending upwardly from said second main body and an engaging recess formed in a front face of said second extension piece, said engaging recess being defined by a wall surface that includes an inner top side, said engaging block of said first main body engaging said engaging recess so that said top side of said engaging block is correspondingly disposed below said inner top side of said wall surface defining said engaging recess when said insert member is inserted into said insertion groove portion and said first engaging member is brought into engagement with said second engaging member.

7. The wall hanger of claim 4, wherein each of said plate portions of said first main body has an inner lateral boundary, and includes a ridge that projects from a front face of said first main body along said inner lateral boundary, said ridges of said plate portions of said first main body being spaced apart from each other, said insert pieces of said insert member extending respectively and integrally from said inner lateral boundaries of said plate portions and extending toward each other, said ridges of said plate portions of said first main body resting respectively against outer edges of said left and right peripheral portions of said third main body when said insert member is inserted into said insertion groove portion.

8. The wall hanger of claim 4, wherein each of said left and right supporting ribs of said third main body has a horizontal section and an inclined section connected to and extending inclinedly downward from said horizontal section, said inclined sections of said left and right supporting ribs having top ends disposed closer to each other and bottom ends disposed farther from each other compared to said top ends of said inclined sections, each of said insert pieces of said insert member having a horizontal outer edge, and an inclined outer edge connected to and extending inclinedly downward from said horizontal outer edge, said inclined outer edges of said insert pieces having top ends disposed closer to each other, and bottom ends disposed farther from each other compared to said top ends of said inclined outer edges, said horizontal outer edges of said insert pieces being respectively supported on said horizontal sections of said left and right supporting ribs, and said inclined outer edges of said insert pieces resting respectively against said inclined sections of said left and right supporting ribs when said insert member is inserted into said insertion groove portion.

9. The wall hanger of claim 1, wherein said first main body has a rear face that at least partially abuts against a front face of said second main body when said first component is insertably coupled to said second component.

10. An assembly comprising:
   a computer device including a housing and an electronic component module provided in said housing; and
   a wall hanger including:
      a first component including a first main body mounted to said computer device, an insert member provided on said first main body, and a first engaging member provided on and extending upwardly from said first main body and located above said insert member; and
      a second component including a second main body for mounting to the wall surface, an insertion groove portion provided on said second main body, and a second engaging member provided on and extending upwardly from said second main body and located above said insertion groove portion, said insert member being inserted into said insertion groove portion along an insertion direction until said first engaging member is brought into engagement with said second engaging member, said first engaging member configured to be pulled toward said computer device so that said first engaging member undergoes an elastic deformation to thereby permit said first engaging member to disengage from said second engaging member.

11. The assembly of claim 10, wherein said first main body includes two plate portions partially spaced apart from each other, said insert member including two insert pieces extending respectively and integrally from said plate portions, said second main body having a rear face for confronting the wall surface, and a front face, said insertion groove portion including two insertion grooves provided at said front face of said second main body and respectively having top openings, said insert pieces being inserted respectively into said insertion grooves in a top-down direction.

12. The assembly of claim 11, wherein said second component further includes a third main body that is partially spaced apart from said front face of said second main body so as to cooperatively define said insertion grooves with said second main body.

13. The assembly of claim 12, wherein said third main body includes left and right supporting ribs that project from a rear face thereof and that configure said third main body into a central securing portion secured to said front face of said second main body, and left and right peripheral portions, each of said left and right peripheral portions being spaced apart from said front face of said second main body to cooperatively define a respective one of said insertion grooves with said front face of said second main body and a respective one of said left and right supporting ribs, said insert pieces resting respectively against said left and right supporting ribs when respectively inserted into said insertion grooves.

14. The assembly of claim 10, wherein said first main body has a front face disposed to confront said computer device and a rear face disposed to confront said second main body, said first engaging member including a first extension piece extending upwardly from said first main body and an engaging block projecting from a rear face of said first extension piece, said engaging block having a top side.

15. The assembly of claim 14, wherein said second engaging member includes a second extension piece extending upwardly from said second main body and an engaging recess formed in a front face of said second extension piece, said engaging recess being defined by a wall surface that includes an inner top side, said engaging block of said first main body engaging said engaging recess so that said top side of said engaging block is correspondingly disposed below said inner top side of said wall surface defining said engaging recess when said insert member is inserted into said insertion groove portion and said first engaging member is brought into engagement with said second engaging member.

16. The assembly of claim 13, wherein each of said plate portions of said first main body has an inner lateral boundary, and includes a ridge that projects from a front face of said first main body along said inner lateral boundary, said ridges of said plate portions of said first main body being spaced apart from each other, said insert pieces of said insert member extending respectively and integrally from said inner lateral boundaries of said plate portions and extending toward each other, said ridges of said plate portions of said first main body resting respectively against outer edges of said left and right peripheral portions of said third main body when said insert member is inserted into said insertion groove portion.

17. The assembly of claim 13, wherein each of said left and right supporting ribs of said third main body has a horizontal section and an inclined section connected to and extending inclinedly downward from said horizontal section, said inclined sections of said left and right supporting ribs having top ends disposed closer to each other and bottom ends disposed farther from each other compared to said top ends of said inclined sections, each of said insert pieces of said insert member having a horizontal outer edge, and an inclined outer edge connected to and extending inclinedly downward from said horizontal outer edge, said inclined outer edges of said insert pieces having top ends disposed closer to each other, and bottom ends disposed farther from each other compared to said top ends of said inclined outer edges, said horizontal outer edges of said insert pieces being respectively supported on said horizontal sections of said left and right supporting ribs, and said inclined outer edges of said insert pieces resting respectively against said inclined sections of said left and right supporting ribs when said insert member is inserted into said insertion groove portion.

18. The assembly of claim 10, wherein said first main body has a rear face that at least partially abuts against a front face of said second main body when said first component is insertably coupled to said second component.

* * * * *